(12) United States Patent
Sato

(10) Patent No.: US 7,334,754 B1
(45) Date of Patent: Feb. 26, 2008

(54) GUIDE RAILS FOR CONVEYING BAND-FORM MEMBERS

(75) Inventor: Koji Sato, Akishima (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 0 days.

(21) Appl. No.: 09/489,700

(22) Filed: Jan. 24, 2000

(30) Foreign Application Priority Data

Jan. 22, 1999 (JP) .................. 11-013831

(51) Int. Cl.
*B65H 57/04* (2006.01)
*B65H 20/00* (2006.01)

(52) U.S. Cl. .................. 242/615.3; 226/189; 198/735.3
(58) Field of Classification Search ............. 242/615.3; 226/17, 189, 190; 198/735.3; 271/264
See application file for complete search history.

(56) References Cited

U.S. PATENT DOCUMENTS 3,358,894 A * 12/1967 Hags .................. 242/615.3 X
3,692,223 A * 9/1972 Laigle et al. ............. 242/615.3
3,896,983 A * 7/1975 Weinguni ................ 242/615.3
3,927,814 A * 12/1975 Holm .................. 242/615.3 X
3,949,920 A * 4/1976 Habert et al. ........ 242/615.3 X
4,846,387 A * 7/1989 Mano ...................... 242/615.3
5,915,611 A * 6/1999 Baldoni et al. ...... 242/615.3 X

FOREIGN PATENT DOCUMENTS

JP H2-54664 A 11/1990

* cited by examiner

*Primary Examiner*—Michael R. Mansen
(74) *Attorney, Agent, or Firm*—Koda & Androlia

(57) ABSTRACT

Guide rails for guiding a band-form member such as a film carrier tape in a semiconductor manufacturing apparatus. The guide rails include a pair of rail main bodies with a plurality of guide assemblies provided on the upper surfaces of the rail main bodies so that the guide assemblies partially guide the upper surface of the band-form member.

5 Claims, 3 Drawing Sheets

GUIDE RAILS FOR CONVEYING BAND-FORM MEMBERS

BACKGROUND OF THE INVENTION

1. Field of the Invention

The present invention relates to guide rails used in a semiconductor manufacturing apparatus for conveying band-form members such as a film carrier tape.

2. Prior Art

Typical band-form member conveying guide rails used in a semiconductor manufacturing apparatus have a structure as shown in FIGS. 3(a) and 3(b).

In this guide rail structure, a pair of guide rails 2A and 2B that guide both side portions of a band-form member 1 are installed so as to face each other. The guide rails 2A and 2B consist of rail main bodies 3A and 3B and vertical-direction guide plates 4A and 4B. The vertical-direction guide plates 4A and 4B are fastened to the upper surfaces of the rail main bodies 3A and 3B so as to form guide grooves 5A and 5B between the rail main bodies 3A and 3B and vertical-direction guide plates 4A and 4B, thus guiding the band-form members 1 in the vertical direction.

Guide rails 2A and 2B of this type are disclosed in, for instance, Japanese Patent Application Publication (Kokoku) No. H2-54664. In this prior art, a pair of guide rails are provided with upper plates with guide grooves in between.

In these conventional band-form member conveying guide rails, the band-form member 1 is conveyed while the entire upper and lower surfaces of both side portions of the band-form member 1 are regulated in the vertical direction by the guide grooves 5A and 5B that are formed by the rail main bodies 3A and 3B and vertical-direction guide plates 4A and 4B. Accordingly, the frictional resistance during the conveyance tends to be large. In particular, when the band-form member 1 is a film carrier tape, the thickness is as thin as 25 to 125 µm, and it is flexible. Thus, undulation and twisting, etc. would occur during the conveying process. As a result of such undulation and twisting, etc., the frictional resistance of the upper and lower surfaces of side portions of the tab tape against the guide grooves 5A and 5B increases, and problems such as shape deformation of the tab tape and damage to the tab tape, etc. occur. In cases where the band-form member 1 is a lead frame, undulation and twisting, etc. would not occur; however, when the frictional resistance is high, the motive power of the conveying power supply needs to be increased.

Furthermore, when some type of trouble occurs during the conveying of the band-form member 1, the conveyance must be stopped so as to remove the band-form member 1 from the guide grooves 5A and 5B. However, since the guide grooves 5A and 5B of the prior art are in a continuous form, it is difficult to remove the band-form member 1 out of these guide grooves 5A and 5B.

SUMMARY OF THE INVENTION

Accordingly, the object of the present invention is to provide band-form member conveying guide rails in which the frictional resistance is reduced, and band-form members can easily be removed from the guide assemblies.

The above object is accomplished by a unique structure of a band-form member conveying guide rails that comprise a pair of guide rails disposed facing each other so as to guide both side portions of a band-form member, and each of the guide rails is comprised of a rail main body and a plurality of guide assemblies, in which the guide assemblies are spacedly installed on the upper surface of the rail main body so that they can guide a part of the upper surface of the band-form member.

In this structure, each of the guide assemblies are comprised of a width-direction guide element and a vertical-direction guide element; and the width-direction guide element is fastened to the rail main body at fixed intervals in the conveying direction of the band-form member so as to guide the band-form member in the width direction, and the vertical-direction guide element is disposed on the width-direction guide element so as to guide the band-form member in the vertical direction.

DETAILED DESCRIPTION OF THE PREFERRED EMBODIMENTS

Figure 1A:
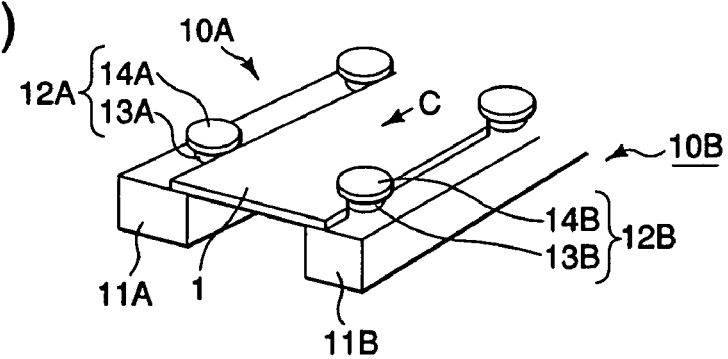
FIG. 1(a) is a perspective view of the first embodiment of the band-form member conveying guide rails according to the present invention.
Figure 1B:
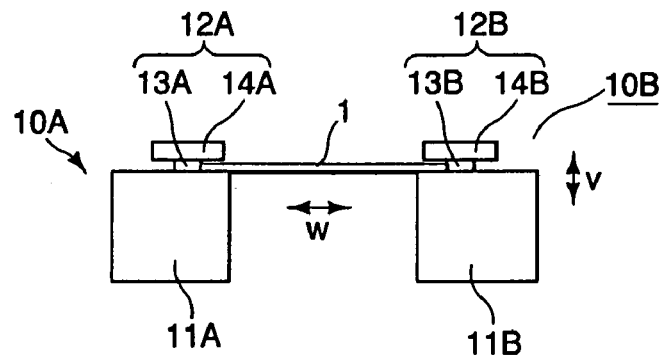
FIG. 1(b) is a view taken from the conveying direction.

A first embodiment of the present invention will be described with reference to FIGS. 1(a) and 1(b).

A pair of guide rails 10A and 10B are installed facing each other so as to guide both sides portions of a band-form member 1, which is, for instance, a film carrier tape which has some degree of flexibility. The guide rails 10A and 10B comprise rail main bodies 11A and 11B and a plurality of guide assemblies 12A and 12B.

The guide assemblies 12A and 12B are provided on the upper surfaces of the rail main bodies 11A and 11B along the conveying direction of the band-form member 1 indicated by an arrow C or in the length-wise direction of the rail main bodies 11A and 11B. The guide assemblies 12A and 12B are comprised of shaft members 13A and 13B and flange members 14A and 14B. The shaft members 13A and 13B are provided so as to act as a width-direction guide that guides the band-form member 1 in the direction of width (shown by arrow W); and the flange members 14A and 14B are provided so as to act as a vertical-direction guide that guides the band-form members 1 in the vertical direction (shown by arrow V). In this embodiment, the shaft members 13A and 13B are cylindrical pillars having heights greater than the thickness of the band-from member 1 to be conveyed, and the flange members 14A and 14B are circular plates having a larger diameter than the shaft members 13A and 13B and installed on the tops of the shaft members 13A and 13B in a coaxial fashion.

Accordingly, the band-form member 1 is conveyed while being regulated in the vertical direction by the spaces between the upper surfaces of the rail main bodies 11A and 11B and the undersurfaces of the flange members 14A and 14B. In this case, the upper surface of the band-form member 1 is partially regulated by the flange members 14A and 14B, in other words, the upper surface of the band-form member 1 is regulated only at points where the upper surface of the band-form member 1 is in contact with the flange members 14A and 1B; and the portions between the guide assemblies 12A and 12B in the conveying direction are not regulated. Accordingly, the frictional resistance during conveying is alleviated, deformation and damage, etc. is less likely occur in the band-form member 1, and only a small conveying power supply is required.

When some type of trouble occurs during the conveying process of the band-form member 1, it is necessary to stop the conveying and take out the band-form member 1 from the surfaces of the rail main bodies 11A and 11B. In this case, according to the present invention, it is only necessary to remove the band-form member 1 from the guide assemblies 12A and 12B. Thus, the band-form member 1 can easily be taken out of the rail main bodies 11A and 11B. Furthermore, after the band-form member 1 has been removed and the trouble has been taken care of, it is necessary merely to insert the band-form member 1 back into the guide assemblies 12A and 12B. Thus, the band-form member 1 can easily be returned to the guide rails 10A and 10B.

Figure 2A:
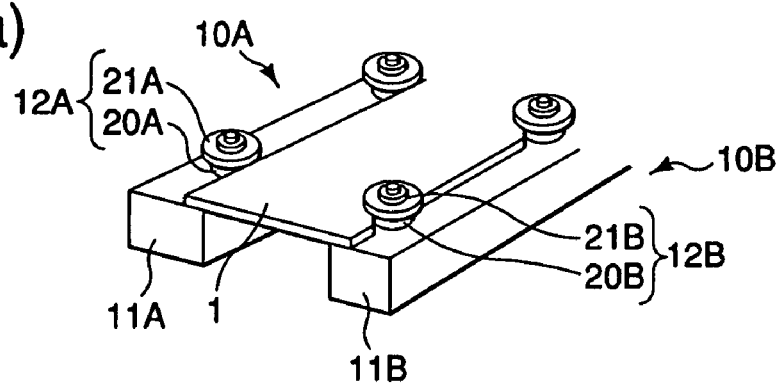
FIG. 2(a) is a perspective view of the second embodiment of the band-form member conveying guide rails according to the present invention.
Figure 2B:
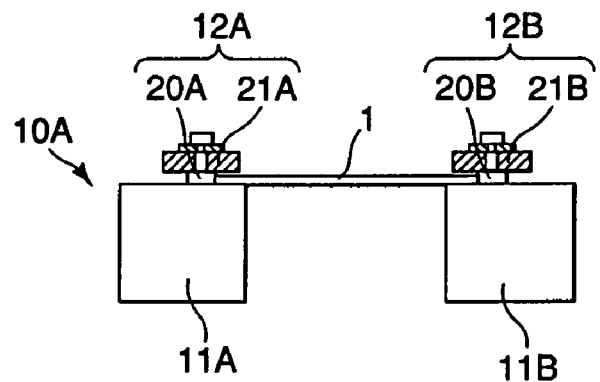
FIG. 2(b) is a view taken from the conveying direction.
Figure 3A:
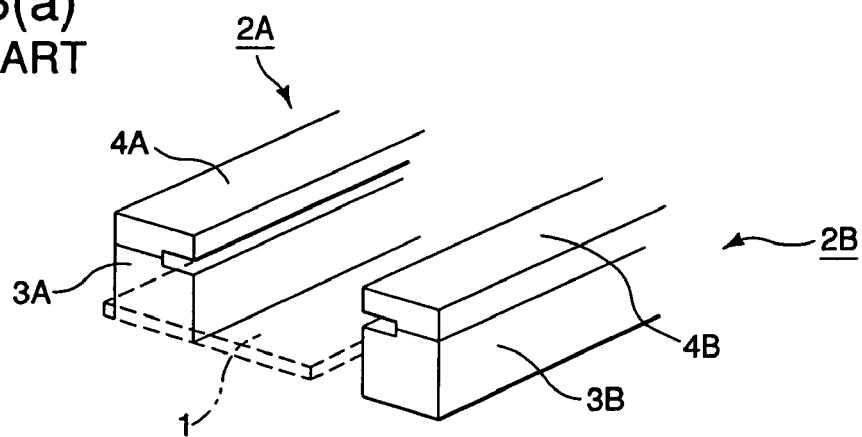
FIG. 3(a) is a perspective view of a conventional example of band-form member conveying guide rails.
Figure 3B:
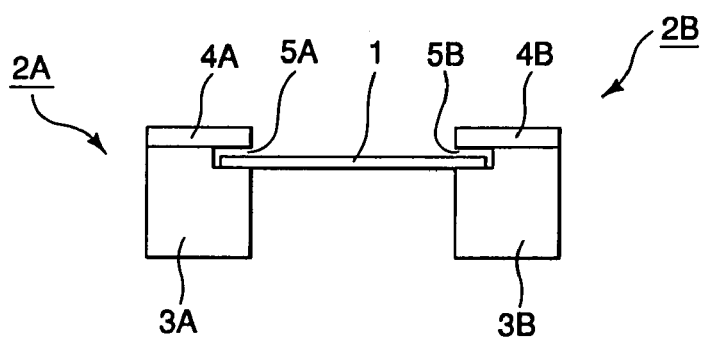
FIG. 3(b) is a view taken from the conveying direction.

FIG. 2 illustrates a second embodiment of the present invention.

In this embodiment, instead of the flange members 14A and 14B used in the first embodiment, rollers 21A and 21B are employed. More specifically, the guide assemblies 12A and 12B are comprised of pin shafts 20A and 20B, which are provided on the rail main bodies 11A and 11B, and rollers 21A and 21B, which are installed on these pin shafts 20A and 20B in a rotatable fashion. Like the first embodiment, the pin shafts 20A and 20B are cylindrical pillars having heights greater than the thickness of the band-from member 1 to be conveyed, and the rollers 21A and 21B are circular in shape with a larger diameter than the pin shafts 20A and 20B and installed on tops of the shaft members 13A and 13B in a coaxial fashion.

Accordingly, in this second embodiment, the spaces between the pin shafts 20A and 20B regulate the horizontal movement of the band-form member 1, and the spaces between the upper surfaces of the rail main bodies 11A and 11B and the undersurfaces of the rollers 21A and 21B partially regulate the band-form members 1 in the vertical direction, in the same manner as in the first embodiment. In the second embodiment, the rollers 21A and 21B can rotate and make rolling contact when the band-form member 1 is conveyed. Accordingly, the frictional resistance is reduced even further than in the first embodiment. Furthermore, the band-form member 1 can easily be removed from the guide rails 10A and 10B.

As seen from the above, according to the present invention, the frictional resistance during the conveying process of band-form members is alleviated, and also the band-form members can easily be taken out of the guide assembly.

What is claimed is:

1. Guide rails for conveying a band-form member comprising a pair of guide rails that are disposed facing each other so as to guide both sides of a band-form member, wherein said guide rails are comprised of rail main bodies and a plurality of guide members provided on said pair of rail main bodies, each of said guide members comprising a cylindrical member provided on said rail main bodies of a height greater than a thickness of said band-form member and a disk provided on said cylindrical member having a diameter greater than that of the cylindrical member.

2. The guide rails according to claim 1, wherein said plurality of guide members are provided on said rail main bodies at fixed intervals in a conveying direction of said band-form member so as to guide said band-form member in a width direction thereof.

3. The guide rails according to claim 2, wherein said disk is rotatably coupled to said cylindrical member.

4. The guide rails according to claim 3, wherein said cylindrical members are spaced apart in a transverse direction to said guide rails an amount equal to a width of the band-form member.

5. The guide rails according to claim 3, wherein said rotatable coupling between said disk and said cylinder comprises a pin provided on a top surface of said cylinder and a hole in a center of said disk which is rotatably fitted on said pin.

* * * * *